United States Patent [19]

Kasperkovitz et al.

[11] Patent Number: 4,574,257

[45] Date of Patent: Mar. 4, 1986

[54] CRYSTAL RESONATOR OSCILLATOR HAVING CIRCUITRY FOR SUPPRESSING UNDESIRED CRYSTAL HARMONICS

[75] Inventors: Wolfdietrich G. Kasperkovitz; Herman W. Van Rumpt, both of Eindhoven, Netherlands

[73] Assignee: U.S. Philips Corporation, New York, N.Y.

[21] Appl. No.: 577,430

[22] Filed: Feb. 6, 1984

[30] Foreign Application Priority Data

May 30, 1983 [NL] Netherlands ............... 8301905

[51] Int. Cl.$^4$ .................................. H03B 5/36
[52] U.S. Cl. ..................... 331/116 R; 331/160; 331/117 R
[58] Field of Search ........ 331/116 R, 116 FE, 117 R, 331/117 FE, 160

[56] References Cited

U.S. PATENT DOCUMENTS 3,199,052  8/1965  Verstraelen ............... 331/116 R
4,193,046  3/1980  Chiba ........................ 331/160

Primary Examiner—Eugene R. LaRoche
Assistant Examiner—James C. Lee
Attorney, Agent, or Firm—Thomas A. Briody; William J. Streeter

[57] ABSTRACT

Oscillator circuit comprising an amplifier arrangement being connected to a reference level an output and an input thereof being coupled via a single signal-carrying terminal to a resonant network which is connected to the same reference level as the amplifier arrangement, the resonant network comprising a crystal resonator. A stable oscillation at a higher order crystal resonant frequency is provided by means of an LC-network which selects said higher order crystal resonant frequency and a resistor connected in parallel across the crystal resonator, which prevents parasitic oscillations at the resonant frequency determined by the components of the LC-network and the case or holder capacitance of the crystal resonator.

4 Claims, 8 Drawing Figures

CRYSTAL RESONATOR OSCILLATOR HAVING CIRCUITRY FOR SUPPRESSING UNDESIRED CRYSTAL HARMONICS

The invention relates to an oscillator circuit comprising an amplifier connected to a reference level. The output as well as an input thereof is coupled by a single signal-carrying terminal to a resonant network which is connected to the same reference level as the amplifier. The resonant network includes a crystal resonator.

Such an oscillator circuit is disclosed in Netherlands Patent Application No. 8,002,064 (PHN 9728), which has been laid open to public inspection.

The amplifier of the prior art oscillator circuit functions as a negative resistance for the resonant network and is simple to implement. Because of the single, signal voltage-carrying connection between this integratable amplifier and the resonant network which cannot be integrated or is difficult to integrate, this prior art oscillator circuit is particularly suitable for use in integrated circuits whose number of pins must be kept to a minimum. In the above-mentioned construction (one-pin crystal oscillator) the crystal resonator stabilizes the oscillation frequency in the resonant network of the known oscillator circuit. Oscillation then occurs only at the first harmonic of the crystal resonator, referred to herein as the first order crystal frequency for the sake of brevity.

SUMMARY OF THE INVENTION

It is an object of the invention to effect a stable oscillation at a higher order crystal frequency in a one-pin crystal oscillator.

According to the invention, an oscillator circuit, includes a resonant network which comprises an LC-network coupled to the crystal resonator for a selection of a higher order resonant frequency of the crystal resonator. A resistor is arranged in parallel with the crystal resonator for preventing oscillations on the parasitic resonant frequency produced by the LC-network and the case or holder capacitance of the crystal resonator.

With the present invention, the amplitude of the (real) in-phase signal which is positively fed back to the amplifier is increased at the desired higher order crystal frequency relative to the amplitude of the signal at the unwanted crystal frequencies by means of the LC-network, and relative to the amplitude of the signal at the said parasitic resonant frequency by means of the said resistor. With a suitable choice of the gain, the oscillating condition is only satisfied at the desired higher order crystal frequency.

In a preferred embodiment of an oscillator circuit according to the invention, the amplifier has a current output which is coupled to the connecting terminal, and the resonant network comprises two branches arranged in parallel between the terminal and the reference level. One branch comprises a series arrangement of one of the two elements of the LC-network and the parallel arrangement of the crystal resonator and the resistor. The other branch comprises the other element of the LC-network, the value of the impedance of the resonant network between the terminal and the reference level being real and smaller at the parasitic resonant frequency than at the higher order resonant frequency of the crystal resonator.

When this arrangement is used, the output current of the amplifier produces across the resonant network a voltage whose amplitude is at a maximum at the selected higher order crystal frequency and which is positively fedback to an input of the amplifier through the terminal.

A further preferred embodiment of such an oscillator circuit includes in one branch the capacitance of the LC-network in series with the parallel arrangement of the crystal resonator and the resistor and that the inductance of the LC-network is included in the said other branch.

When this measure is applied a simple d.c. setting of the amplifier is possible.

A further preferred embodiment of an oscillator circuit according to the invention includes for the amplifier a voltage output which is coupled to the terminal, and the LC-network is a series LC-network between the terminal and the reference level in series with the parallel arrangement of the crystal resonator and the resistor. The value of the impedance of the resonant network between the terminal and the reference level is real and greater at the parasitic resonant frequency than at the higher order resonant frequency of the crystal resonator.

When this measure is applied, the output voltage of the amplifier produces a current through the resonant network, whose amplitude is at its maximum at a selected higher order crystal frequency and which is positively fedback to an input of the amplifier arrangement through the terminal.

The invention will be further explained with reference to the Figures, which serve as examples and in which corresponding elements have been given the same reference numerals.

DESCRIPTION OF THE PREFERRED EMBODIMENT

Figure 1:
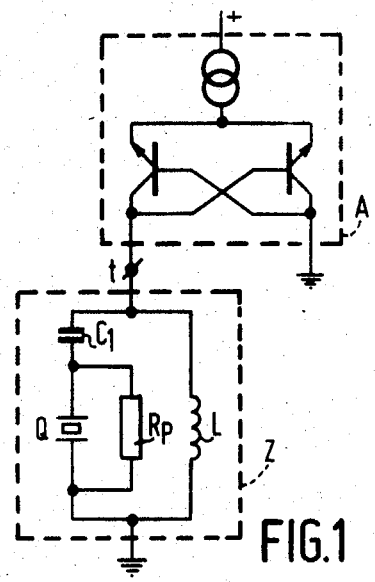
FIG. 1 shows an oscillator circuit according to the invention.

FIG. 1 shows an oscillator circuit according to the invention comprising an integrated amplifier A, which is connected to a grounded resonant network Z through a signal-carrying terminal t, the ground reference contact of the resonant network Z corresponding to that of the amplifier A.

The amplifier A is known per se and used in the integrated circuit TDA 7000. For an understanding of the invention it is sufficient to mention that the amplifier A is a voltage-controlled current amplifier whose terminal t constitutes both the voltage input and the current output. The amplifier arrangement A applies to the resonant network Z through the terminal t an output current which is controlled by the voltage across this resonant network Z and which consequently must be understood to be a negative resistance $-R$, which is in parallel with the resonant network Z.

As is known, oscillation occurs at a loop gain equal to unity. In the embodiment shown this takes place when the impedance of the resonant network Z is real and at least equally large as the gain/ $-R$/ of the amplifier A. If such a situation occurs at different frequencies, then the oscillation frequency at which the impedance is real and at its maximum will be dominant over the other frequencies.

The resonant network Z comprises a parallel LC-network $LC_1$ of which the capacitance $C_1$ is arranged in a first branch between the terminal t and ground in series with a parallel arrangement of a crystal resonator Q and a resistor $R_p$ and of which an inductance L is included in a second branch which is arranged in parallel across the first branch.

Figure 2:
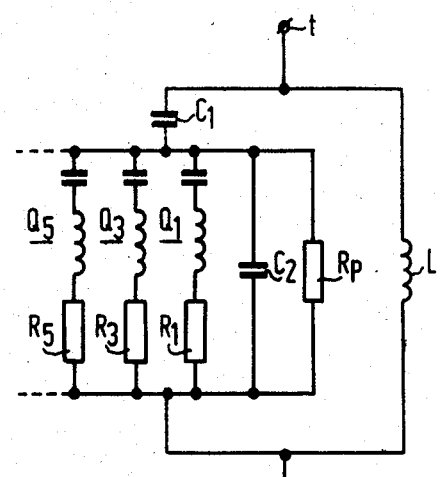
FIG. 2 shows an equivalent circuit diagram of the resonant network of the oscillator circuit of FIG. 1.

FIG. 2 shows the resonant network Z in which the crystal resonator Q is represented by a plurality of parallel RLC-series resonant networks $Q_1, Q_3, Q_5 \ldots$, each having a comparatively high quality factor and each being tuned to one of the respective crystal frequencies $f_o, 3f_o, 5fo \ldots$, $f_o$ being the first order or fundamental crystal frequency. The case or holder capacitance of the crystal resonator Q, called crystal capacitance hereinafter, is represented by means of a capacitor $C_2$, which is connected in parallel across the RLC series resonant networks $Q_1, Q_3, Q_5 \ldots$.

Figure 3A:
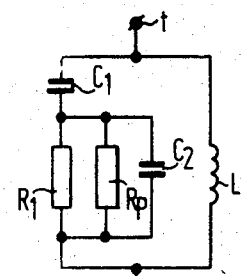
FIGS. 3A, B and C show equivalent circuit diagrams of the resonant network of the oscillator circuit at the first and third order crystal frequencies and at the parasitic resonant frequency.
Figure 3B:
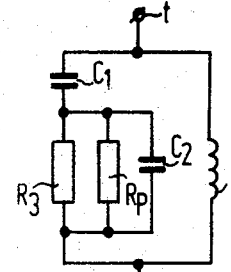

Because of said comparatively high quality factors, the crystal resonator Q can be represented, in the resonant mode, by the parallel arrangement of one of the comparatively low series resistances $R_1, R_3 \ldots$ of the series resonant networks $Q_1, Q_3 \ldots$ and the crystal capacitance $C_2$. FIGS. 3A and 3B show, by way of example, the equivalent circuit diagram of the resonant network Z at the first and the third order crystal frequency, respectively ($f_o$ and $3f_o$, respectively). The series resistors $R_1$ and $R_3$ are of approximately the same order of magnitude and are not only arranged in parallel with the above-mentioned crystal capacitance $C_2$ but also in parallel with the resistance $R_p$.

Figure 3C:
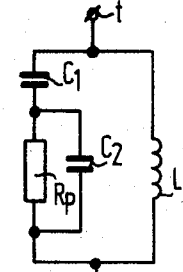

If oscillation is desired at, for example, the third order crystal frequency $3f_o$, then the resonant frequency of the parallel LC-network $LC_1$ must be chosen equal or at least substantially equal thereto, so that the real impedance of the resonant network Z at this desired crystal frequency $f_o$ is at least higher than the real part of the impedance at the other crystal frequencies $f_o, 5f_o, 7f_o \ldots$ However, in combination with the crystal capacitance $C_2$ the parallel LC-network $LC_1$ produces a parasitic resonant frequency ($f_{par}$), independent of the state of the crystal resonator Q. At this parasitic resonant frequency $f_{par}$ the resonant network Z can be represented by the equivalent circuit diagram shown in FIG. 3C, in which the impedance of the crystal resonator is only determined by its crystal capacitance $C_2$.

When the resistor $R_p$ is not present, that is to say $R_p = \infty$, then the losses in the resonant network Z at the crystal frequencies $f_o, 3f_o \ldots$ are respectively determined by the series resistors $R_1, R_3 \ldots$ and there are no losses at the parasitic resonant frequency $f_{par}$. Consequently, the impedance of the resonant network Z is not only real but also at its maximum at the last-mentioned $f_{par}$. Thus, the oscillator circuit will oscillate at this unwanted parasitic resonant frequency $f_{par}$, which is sensitive to temperature-fluctuations and ageing of the components. Now the impedance of the resonant network Z, particularly at the unwanted parasitic resonant frequency $f_{par}$ is reduced by means of the resistance $R_p$ relative to the impedance at the desired third order crystal frequency $3f_o$.

Figure 4:
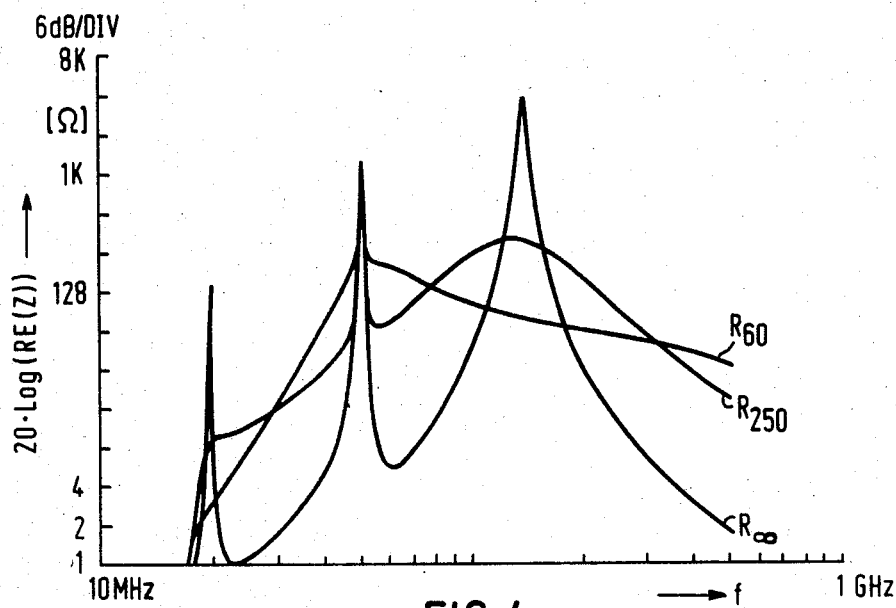
FIG. 4 shows the frequency-dependent variation of the real part of the impedance of the resonant network, with the resistance arranged in parallel with the crystal resonator as a parameter.
Figure 5:
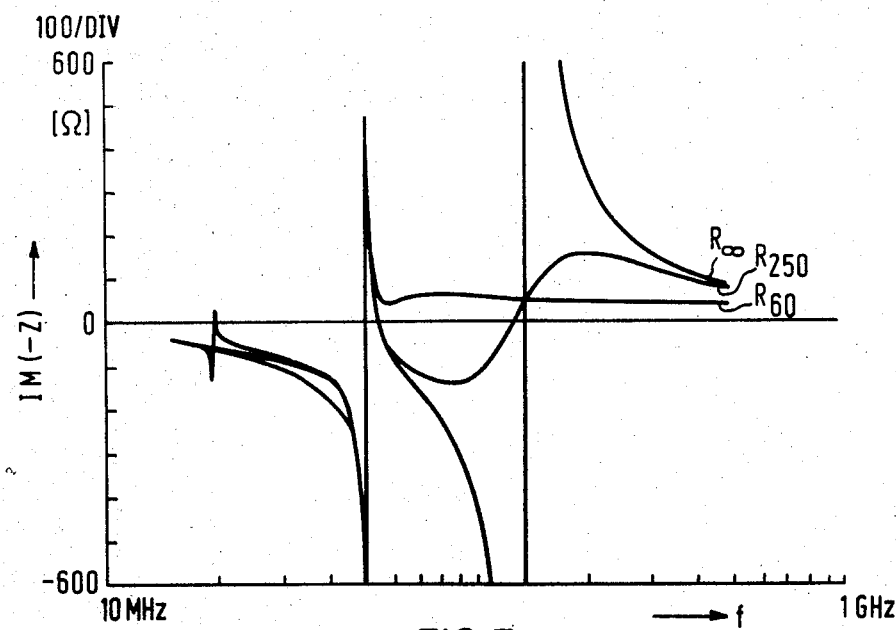
FIG. 5 shows the frequency-dependent variation of the imaginary part of the impedance of the resonant network, with the said resistance as a parameter.

The influence of the resistance $R_p$ on the impedance of the resonant network Z is represented in FIGS. 4 and 5 by curves $R_\infty$ ($R_p = \infty$), $R_{250}$ ($R_p = 250\Omega$) and $R_{60}$ ($R_p = 60\Omega$). FIG. 4 shows the frequency-dependent variation of the real part of the impedance of the resonant network Z and FIG. 5 shows the imaginary part of that impedance. This is based on a crystal resonator Q having a desired $3^{rd}$ order crystal frequency $3f_o$ of 50 MHz, a crystal capacitance of approximately 5 pF and series resonant resistors $R_1$ and $R_3$ of $7\Omega$ and $10\Omega$, respectively, a capacitance $C_1$ of 25 pF and an inductance L of 400 nH. FIG. 4 shows that at a resonant frequency of the parallel LC-network $LC_1$ equal to the desired third order crystal frequency $3f_o$ (50 MHz), a decreasing resistance $R_p$ hardly affects the impedance of the resonant network Z at this desired crystal frequency $3f_o$, and that this decreasing resistance reduces to a very high extent said impedance at the unwanted crystal frequency $f_o$ and particularly so at the parasitic resonant frequency $f_{par}(3\sqrt{5}f_o)$. FIG. 5 shows that this resistance $R_p$ prevents for low values (for example $R_p = 60\Omega$) zero-crossings in the imaginary part of the impedance of the resonant network Z at the unwanted resonant frequencies ($f_o, f_{par}$). The impedance is then only real at the desired crystal frequency $3f_o$.

In the example given an effective suppression of oscillation at the non-wanted resonant frequencies $f_{par}, f_o, 5f_o \ldots$ is accomplished at a value of $R_p$ of approximately $250\Omega$. It will be obvious that $R_p$ cannot be chosen to have an unlimited low value, as then the crystal resonator Q will be attenuated too highly. In order to keep the influence of the resistance $R_p$ on the impedance of the resonant network Z low at the desired crystal frequency $3f_o$, this resistance $R_p$ must exceed the value of the series resonant resistance $R_3$ (see FIG. 3B) to such a large extent that $R_p$ hardly affects the parallel values of $R_p$ and $R_3$.

It will be obvious that the effective value of the resistance $R_p$ is also determined by the capacitance ratio between $C_1$ and $C_2$ it will not be difficult for a person skilled in the art to determine an effective value for $R_p$ at component values and for crystal frequencies ($5f_o, 7f_o \ldots$) other than those of the above example. Oscillation at the parasitic resonant frequency $f_{par}$ can be prevented and only oscillation occurring at the desired higher order crystal frequency stabilized by the crystal resonator Q will occur.

In the embodiment shown, the inductance L forms a direct current path which simplifies the direct current setting of the amplifier A. The positions of the components $C_1$ and L of the parallel LC-network $LC_1$ in the resonant network Z is, however, in principle not important for the invention and these positions can be mutually interchanged when the direct current supply to the amplifier A is adapted thereto.

Figure 6:
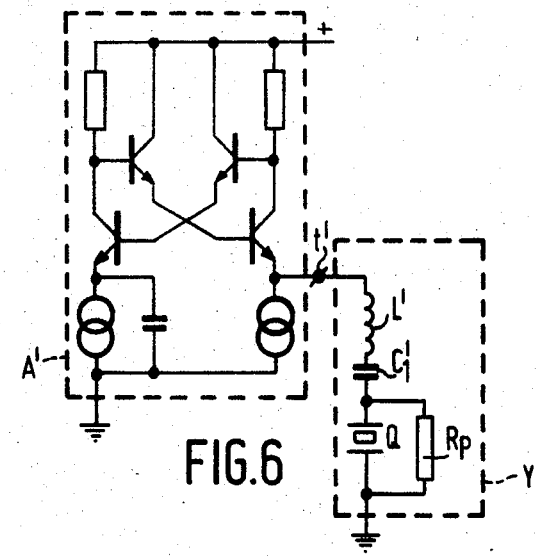
FIG. 6 shows an oscillator circuit according to the invention, which is structurally analogous to the one of FIG. 1.

In addition, it is possible to apply the invention to an oscillator circuit which is structurally analogous with regard to the oscillator circuit shown in FIG. 1, this dual circuit being shown in FIG. 6. It comprises an amplifier A' which is connected to a resonant network Y through a terminal t'. The amplifier A' is known per se, for example, from the German Patent Application No. 3,104,849, which has been laid open to public inspection. To understand the invention it is sufficient to known that this amplifier A' operates as a current-controlled voltage source whose terminal t' constitutes both the voltage output and the current input. The amplifier through A' supplies via the terminal t' an output voltage which is controlled by the current through the resonant network Y and must consequently be considered as a negative resistance $-R$ which, for alternating current, is arranged in series with the resonant network Y. Arranged between the terminal t' and a ground-reference level the resonant network Y comprises a series LC-network $L'C_1'$, which is arranged in series with the parallel arrangement of the crystal resonator Q and the resistor $R_p$.

In accordance with what has been described for the resonant network Z, a stable oscillation at a desired higher order crystal frequency ($3f_o$, $5f_o$ ...) is obtained by choosing the resonant frequency of the series LC-network $L'C_1'$ to be equal to this desired higher order crystal frequency and by choosing the resistance $R_p$ such that the real value of the impedance of the resonant network Y between the terminal t' and the ground-reference level at the parasitic resonant frequency, which is now determined by the values of the components $L'$, $C_1'$ and $C_2$, is higher than at the desired crystal frequency.

What is claimed is:

1. An oscillator circuit comprising:
   an amplifier having a reference level connection, and input and output connected to a signal carrying terminal; and
   a resonant network having one end connected to said signal carrying terminal, and another end connected to said reference level connection, said resonant network including:
   (a) a crystal resonator;
   (b) an LC-network coupled to said crystal resonator for selecting a higher order resonator frequency of said crystal resonator; and
   (c) a resistor connected in parallel with said crystal resonator for suppressing oscillations at a parasitic oscillation frequency produced from said LC-network and a case capacitance associated with said crystal resonator.

2. An oscillator circuit as claimed in claim 1, wherein the amplifier has a current output which is coupled to the terminal and the resonant network comprises two parallel branches connected between the terminal and the reference level connection, one branch comprising a series circuit of one of the two components of the LC-network and the parallel circuit of the crystal resonator and said resistor, and the other branch comprising the other component of the LC-network, the resonant network having an impedance between the terminal and the reference level connection which is real and smaller at the parasitic resonant frequency than at the higher order resonant frequency of the crystal resonator.

3. An oscillator circuit as claimed in claim 2, wherein said one branch includes the capacitance of the LC-network in series with the parallel connected crystal resonator and resistor, and said other branch includes the inductance of the LC-network.

4. An oscillator circuit as claimed in claim 1, wherein the amplifier has a voltage output which is coupled to the terminal and the LC-network is a series LC-network connected between the terminal and the reference level in series with the parallel crystal resonator and resistor, the value of the impedance of the resonant network between the terminal and the reference level being real and greater at the parasitic resonant frequency than at said higher order resonant frequency of the crystal resonator.

* * * * *